United States Patent
Sredanovic et al.

(10) Patent No.: US 6,222,776 B1
(45) Date of Patent: Apr. 24, 2001

(54) PROGRAMMABLE LATCHES THAT INCLUDE NON-VOLATILE PROGRAMMABLE ELEMENTS

(75) Inventors: Nikolas Sredanovic; Helena Calendar, both of Mountain View, CA (US)

(73) Assignee: Mosel Vitelic, Inc., Hsin Chu (TW)

( * ) Notice: Subject to any disclaimer, the term of this patent is extended or adjusted under 35 U.S.C. 154(b) by 0 days.

(21) Appl. No.: 09/669,780

(22) Filed: Sep. 25, 2000

Related U.S. Application Data

(62) Division of application No. 09/516,336, filed on Mar. 1, 2000, which is a division of application No. 09/178,445, filed on Oct. 23, 1998, now Pat. No. 6,163,492.

(51) Int. Cl.[7] .................................. G11C 7/00
(52) U.S. Cl. ................ 365/189.01; 365/189.05; 365/189.11; 365/225.7
(58) Field of Search ............. 365/189.01, 189.05, 365/225.7, 189.11

(56) References Cited

U.S. PATENT DOCUMENTS

| | | | |
|---|---|---|---|
| 4,387,503 | 6/1983 | Aswell et al. | 29/575 |
| 4,404,635 | 9/1983 | Flaker | 364/481 |
| 4,532,402 | 7/1985 | Overbeck | 219/121 LU |
| 4,532,607 | 7/1985 | Uchida | 365/96 |
| 4,546,455 | 10/1985 | Iwahashi et al. | 365/200 |
| 4,614,881 | 9/1986 | Yoshida et al. | 307/219 |
| 4,617,651 | 10/1986 | Ip et al. | 365/200 |
| 4,725,979 | 2/1988 | Hoberman | 365/96 |
| 4,771,285 | 9/1988 | Agrawal et al. | 340/825 |
| 4,779,229 | 10/1988 | Agrawal | 365/94 |
| 4,837,520 | 6/1989 | Golke et al. | 324/550 |
| 4,852,044 | 7/1989 | Turner et al. | 364/900 |
| 4,943,804 | 7/1990 | Lee et al. | 340/825 |
| 5,066,998 | 11/1991 | Fischer et al. | 357/51 |
| 5,086,331 | 2/1992 | Hartgring et al. | 357/51 |
| 5,134,585 | 7/1992 | Murakami et al. | 365/200 |
| 5,185,291 | 2/1993 | Fischer et al. | 437/173 |
| 5,258,953 | 11/1993 | Tsujimoto | 365/200 |
| 5,440,246 | 8/1995 | Murray et al. | 326/38 |
| 5,459,684 | 10/1995 | Nakamura et al. | 365/149 |
| 5,497,355 | 3/1996 | Mills et al. | 365/230.08 |
| 5,506,638 | 4/1996 | Cowles et al. | 326/38 |
| 5,526,320 | 6/1996 | Zager et al. | 365/233.5 |
| 5,544,124 | 8/1996 | Zager et al. | 365/230.08 |
| 5,566,107 | 10/1996 | Gilliam | 365/200 |
| 5,640,364 | 6/1997 | Merritt et al. | 365/233.5 |
| 5,710,741 | 1/1998 | McLaury | 365/226 |
| 5,793,688 | 8/1998 | McLaury | 365/203 |
| 5,812,489 | 9/1998 | Matsui | 365/233 |
| 5,870,342 | 2/1999 | Fukuda | 365/201 |
| 5,898,621 | 4/1999 | Takahashi et al. | 365/185.33 |

FOREIGN PATENT DOCUMENTS 288 689    10/1983   (DE) .

OTHER PUBLICATIONS

B. Prince, "High Performance Memories" New Architecture DRAMs and SRAMs Evolution and Function,1996, pp. 135–227.

B. Prince, "Semiconductor Memories" A Handbook of Design, Manufacture and Application, Second Edition, (1991), pp. 762–764.

"Synchronous Graphics RAM" Micron Technology, Inc. of Boise Idaho, 1998, pp. 1–45.

*Primary Examiner*—Viet Q. Nguyen
(74) *Attorney, Agent, or Firm*—Skjerven Morrill MacPherson, LLP; Michael Shenker

(57) ABSTRACT

A non-volatile programmable latch (210) has a fuse (F1) connected between a non-ground voltage terminal (212) and an output terminal (OUT). A NMOS transistor (110) is connected between the output terminal and ground. An inverter (120) has an input connected to the output terminal and an output connected to the gate of the NMOS transistor. A diode connects the output terminal to the non-ground voltage terminal (212) to prevent a charge build up on the output terminal when the power is off.

6 Claims, 5 Drawing Sheets

PROGRAMMABLE LATCHES THAT INCLUDE NON-VOLATILE PROGRAMMABLE ELEMENTS

CROSS-REFERENCE TO RELATED APPLICATIONS

This application is a divisional application of U.S. patent application Ser. No. 09/516,336, filed on Mar. 1, 2000, which is a divisional of U.S. patent application Ser. No. 09/178,445 which was filed on Oct. 23, 1998 now U.S. Pat. No. 6,163,492, and which is incorporated herein by reference.

STATEMENT REGARDING FEDERALLY SPONSORED RESEARCH

Not applicable.

BACKGROUND OF THE INVENTION

The present invention relates to programmable latches that include non-volatile programmable elements. Examples of non-volatile programmable elements are fuses.

Programmable latches with fuses are used in integrated circuits to enable modification of the circuits without changing the masks used for circuit fabrication. For example, fuse programmable latches are used to replace defective memory cells with spare cells in semiconductor memories.

FIG. 1 shows one such latch described in U.S. Pat. No. 4,546,455 issued Oct. 8, 1985 to Iwahashi et al. Fuse F1 is connected between the power supply terminal VDD and the latch output terminal OUT. An NMOS transistor 110 is connected between the terminal OUT and the ground terminal. Three serially connected inverters 120.1, 120.2, 120.3 are provided between the output terminal OUT and the gate of transistor 110.

If fuse F1 is intact, the terminal OUT is pulled to VDD. The inverters 120 keep transistor 110 off. If fuse F1 is blown, the terminal OUT is at the ground voltage. The inverters turn transistor 110 on to keep the terminal OUT at ground.

Bypass capacitor 130 is connected between the input of inverter 120.3 and the ground terminal to insure correct initialization of the latch on power-up. More particularly, when the power is off, transistor 110 is non-conductive. Therefore, terminal OUT is floating. According to U.S. Pat. No. 4,546,455, the terminal OUT may "tend to have its potential raised to a logic level '1'". In addition, the terminal OUT potential may become "unstable due to the capacitive coupling" in the integrated circuit. Consequently, during operation, transistor 110 could be off even if the fuse F1 were blown. As a result, the terminal OUT would provide an erroneous voltage.

Capacitor 130 is intended to avoid such malfunction. During power up, capacitor 130 keeps the input of inverter 120.3 low sufficiently long to allow the inverter to turn on transistor 110 and discharge the terminal OUT to ground if the fuse is blown. Then the ground voltage on terminal OUT propagates through the three inverters to keep transistor 110 on.

It is desirable to provide alternative programmable latches.

SUMMARY

Some embodiments of the present invention provide simple and reliable programmable latches. Some programmable latches are reliable because they do not depend on delays such as delays provided by capacitor 130. Dependence on delays is undesirable because delay-dependent circuits may not operate properly if VDD rises slowly. Some latches are simple because they omit capacitor 130 and include only one CMOS inverter.

High reliability is achieved in some embodiments by a diode that keeps a voltage on a latch output terminal within a predetermined range of values before power is supplied to the latch. In some embodiments, the diode's anode is connected to terminal OUT, and the cathode is connected to an external power supply pin EVCC or to a reference voltage terminal. When power is off, the EVCC pin or the reference voltage terminal is at ground, and therefore the voltage on the terminal OUT is not higher than one diode threshold voltage relative to ground (0.65V in some embodiments.) The maximum voltage of 0.65V on terminal OUT allows the latch to be powered up correctly even if fuse F1 is blown.

In some embodiments, the diode's cathode is connected to a reference voltage which is used also in other parts of the integrated circuit. The reference voltage is generated by a reference voltage generator which includes one or more pull-down resistors connected to the reference voltage terminal and to the ground terminal. When the power is off, these resistors discharge the reference voltage terminal to ground. Hence, the OUT voltage is not higher than one diode threshold relative to ground when the power is off.

Prior art latch of FIG. 1 has an advantage that a latch initialization does not require a latch initialization signal from outside the latch. The state of the latch is completely determined by the state of fuse F1 and the voltages on the VDD and ground terminals. This advantage is preserved in some embodiments of the present invention. This advantageously distinguishes such embodiments of the invention from the latch described in U.S. Pat. No. 5,566,107 issued Oct. 15, 1996 to Gilliam in describing a circuit that needs an external "activate" signal for initialization.

Some embodiments do not include a capacitor to generate a delay.

In some embodiments, only one inverter having a pull-up device and one pull-down device is provided between the output terminal OUT and the gate of transistor 110.

Some embodiments with only one CMOS inverter and no capacitor operate successfully even without a diode because in such embodiments the voltage on the terminal OUT is at the ground level before the power is turned on. The voltage could drift away from the ground level during fuse programming if, for example, the fuse is programmed electrically. (of note, some embodiments use laser programmable fuses rather than electrically programmable fuses.) However, even if the voltage on terminal OUT becomes high when the fuse is being programmed, the power is turned off after programming, and the voltage on the terminal OUT is allowed to return to ground before the power is turned on again.

Further, in some embodiments, even if the voltage on the terminal OUT is at a high value immediately before the power is turned on, the latch operates properly due to the selection of the trip voltage of the inverter and/or the threshold voltage of transistor 110.

Other features and advantages of the invention are described below. The invention is defined by the appended claims.

DESCRIPTION OF PREFERRED EMBODIMENTS

Figure 1:
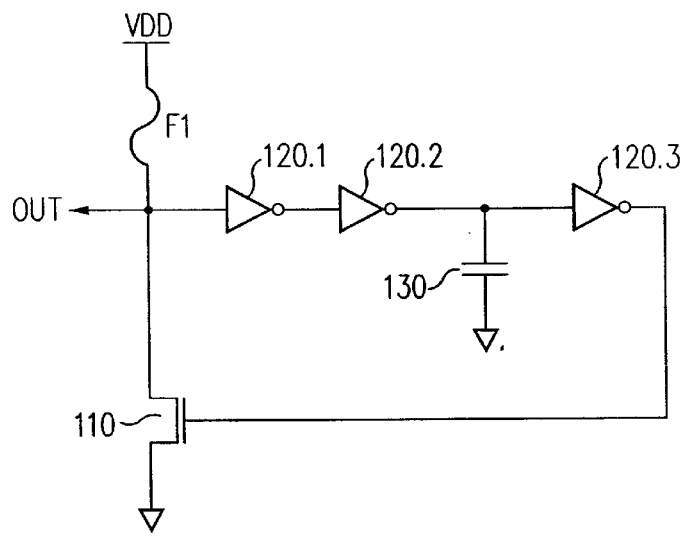
FIG. 1 is a circuit diagram of a prior art programmable latch.
Figure 2A:
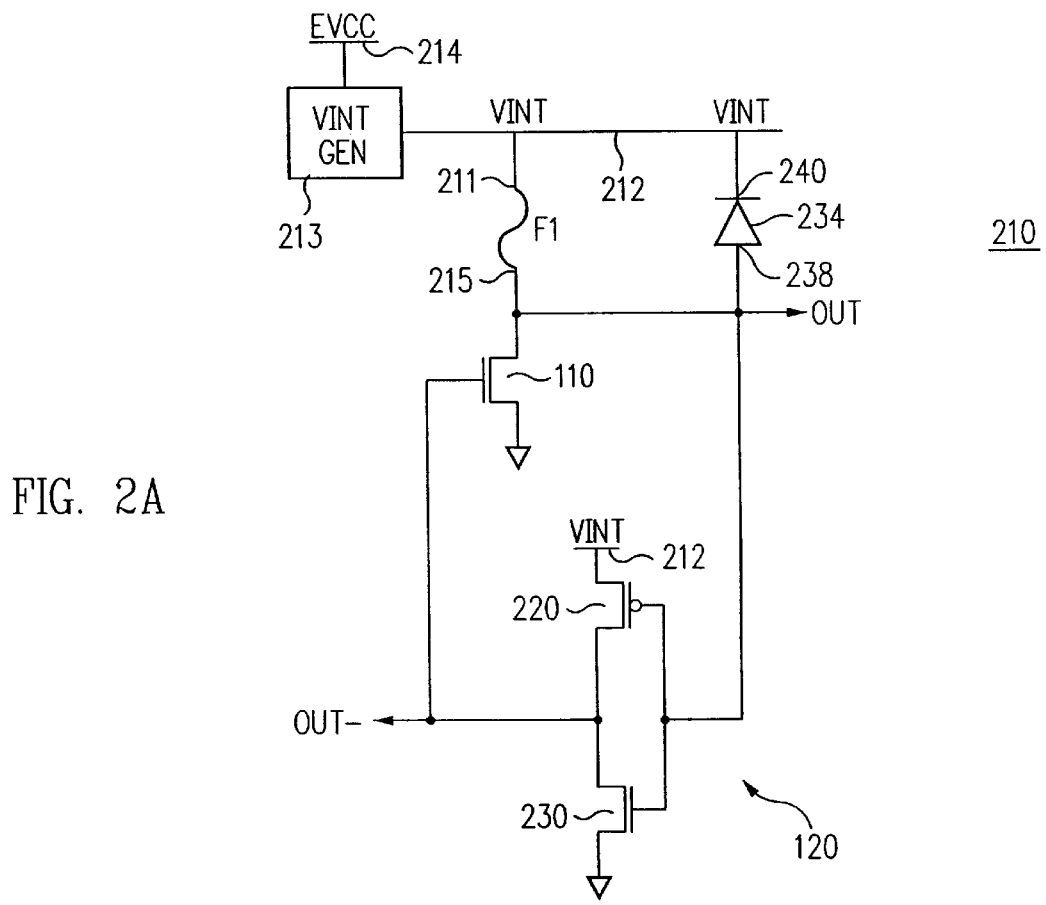
FIG. 2A is a circuit diagram of a programmable latch according to the present invention.

FIG. 2A illustrates a programmable latch 210 according to the present invention. Terminal 211 of fuse F1 is connected to a terminal 212 providing a constant non-ground voltage VINT. Voltage VINT is an internal power supply voltage generated by VINT generator 213 from an external power supply voltage EVCC received on an external pin 214 of the integrated circuit containing the latch 210. Voltage VINT also powers other parts of the integrated circuit. Voltage VINT is a positive voltage.

Terminal 215 of fuse F1 is connected to terminal OUT.

The terminal OUT is connected to the drain of NMOS transistor 110 whose source is connected to a ground terminal.

Terminal OUT is connected to the input of CMOS inverter 120 formed by PMOS pull-up transistor 220 and NMOS pull-down transistor 230. The inverter input is connected to the gates of transistors 220, 230. The source of transistor 220 is connected to VINT terminal 212. The source of transistor 230 is connected to the ground terminal. The drains of the two transistors are connected to complimentary output terminal OUT- of latch 210. Terminal OUT- is connected to the gate of transistor 110.

Diode 234 has its anode terminal 238 connected to terminal OUT and its cathode terminal 240 connected to the VINT terminal 212. When the power is off, the VINT terminal is at ground. (VINT terminal is connected to ground by a resistor network in generator 213, as described below in connection with FIG. 3.) Therefore, the voltage on the terminal OUT is not higher than one threshold voltage of diode 234. If diode 234 is a silicon PN junction diode, the voltage on terminal OUT is not higher than 0.65V. This value is below the trip voltage of inverter 120 and even below the threshold voltage of NMOS transistor 230 (the threshold voltage of transistor 230 is 1.2V in some embodiments). Therefore, if fuse F1 is blown, transistor 230 remains off when the power is turned on. As soon as transistor 220 charges the gate of transistor 110 to the threshold voltage of transistor 110, transistor 110 connects the terminal OUT to ground.

If fuse F1 is conductive, then terminal OUT is at VINT, and transistor 110 is turned off by inverter 120.

During operation of latch 210 the diode is off and thus no current flows through diode 234.

Figure 2B:
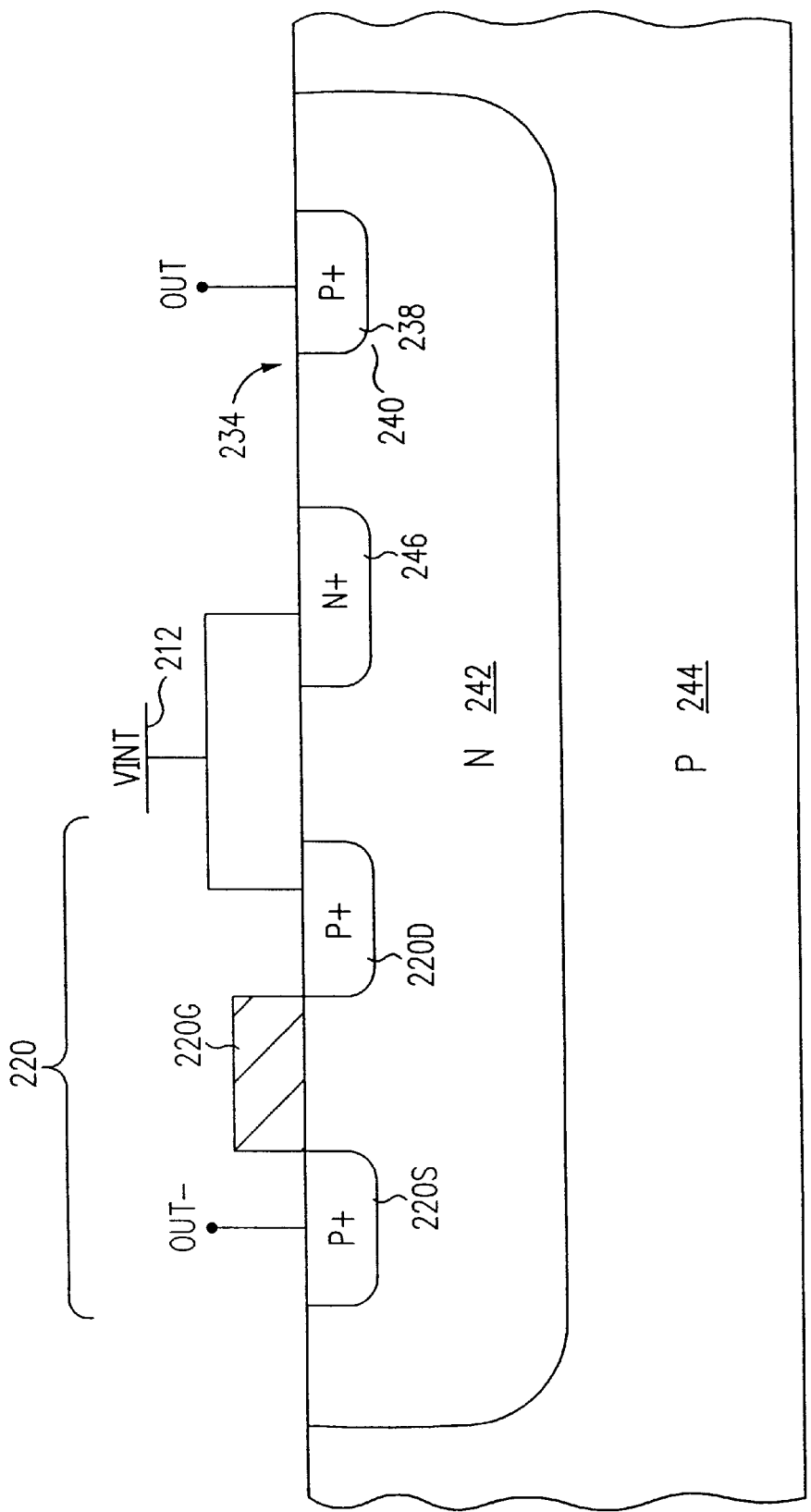
FIG. 2B illustrates a semiconductor cross section of the latch of FIG. 2A.

FIG. 2B illustrates a cross section of a portion of the integrated circuit incorporating the latch 210 in some embodiments. The source 220S and the drain 220D of transistor 220 are P+ semiconductor regions in N well 242 in P substrate 244. Gate 220G of transistor 220 is separated from N well 242 by silicon dioxide (not shown). The N well is connected to the VINT terminal via an ohmic contact in the N+ region 246 formed in the N well. The diode cathode 238 is a P+ region formed in the N well. The diode is formed by the PN junction between the region 238 and the surrounding region 240 of N well 242.

No external signal is used to initialize the latch. The state of the latch (the voltage on the terminal OUT) during the latch operation is completely determined by the state of fuse F1 and by the voltages on the terminal 212 and the ground terminal.

Figure 3:
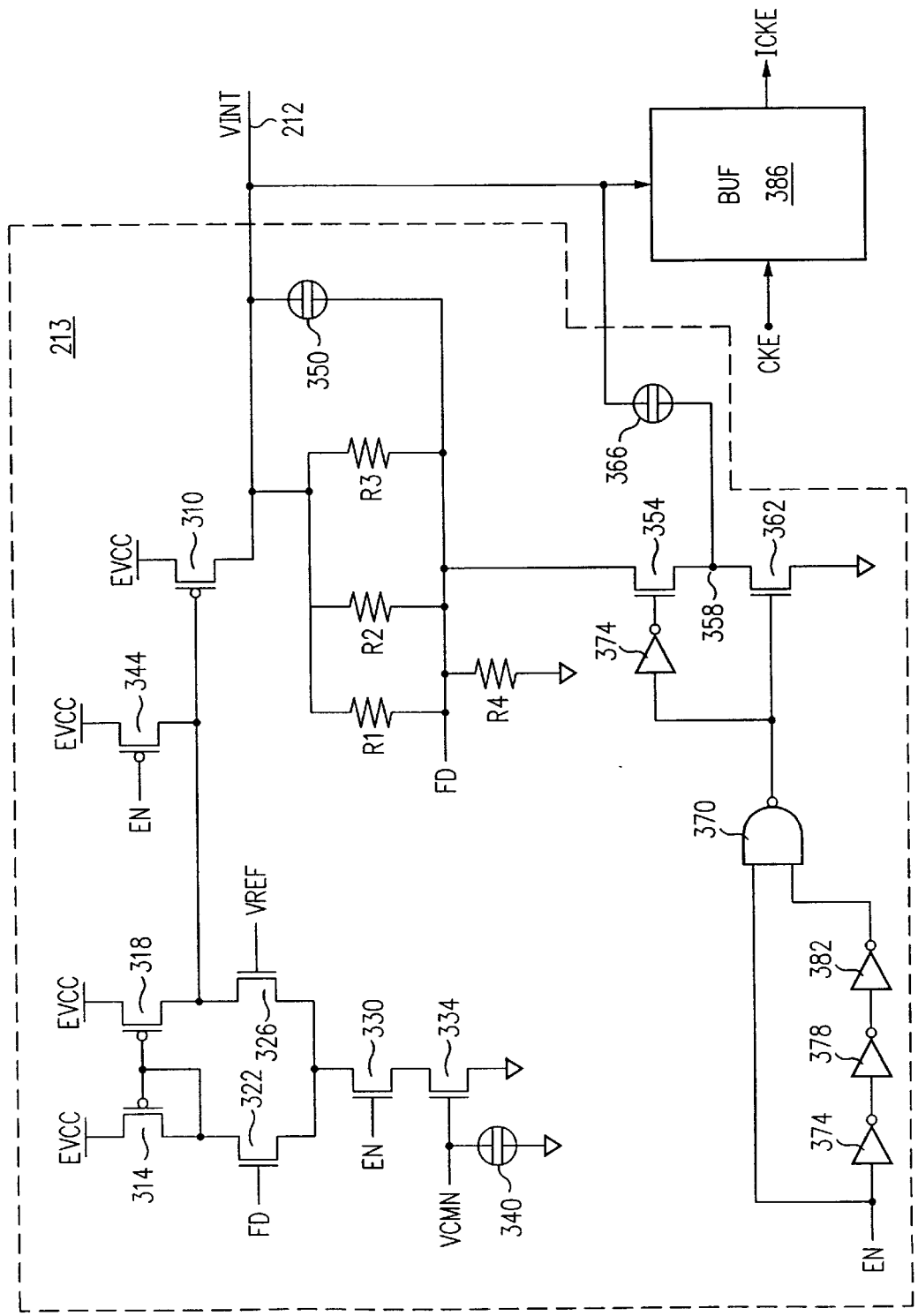
FIG. 3 is a circuit diagram illustrating a reference voltage generator that powers the latch of FIG. 2A.

FIG. 3 shows one embodiment of VINT generator 213. The output terminal 212 of the VINT generator is connected to ground by a resistor network which includes: (1) resistors R1, R2, R3 connected in parallel between terminal 212 and a node FD; and (2) resistor R4 interconnecting the node FD and the ground terminal.

The pull-up path between the terminal 212 and the external voltage supply EVCC is through PMOS transistor 310. The gate of transistor 310 is connected to the output of a differential amplifier formed by PMOS transistors 314, 318 and NMOS transistors 322, 326, 330 and 334. The sources of transistors 314, 318 are connected to the EVCC pin. The gates are connected to each other and to the drain of transistor 314. The drain of transistor 318 is the amplifier output connected to the gate of transistor 310. The drain of transistor 318 is also connected to the drain of transistor 326. The drain of transistor 314 is connected to the drain of transistor 322. The gate of transistor 322 is connected to the node FD. The gate of transistor 326 receives a reference voltage VREF generated by some reference voltage generator (not shown) as known in the art. The sources of transistors 322, 326 are connected to the drain of transistor 330. The source of transistor 330 is connected to the drain of transistor 334. The source of transistor 334 is connected to ground.

The gate of transistor 334 receives a reference voltage VCMN generated by a reference voltage generator (not shown). The gate of transistor 334 is also connected to ground through MOS capacitor 340. (A MOS capacitor is a capacitor formed by a MOS transistor whose source and drain are shorted together.) The gate of transistor 330 receives an enable signal EN. The signal EN is also delivered to the gate of PMOS transistor 344 whose drain is connected to the gate of transistor 310 and whose source is connected EVCC. When EN is low (ground), the VINT terminal 212 is at ground. When EN is at EVCC, the terminal 212 provides a voltage between ground and EVCC.

Terminal 212 is connected to node FD by MOS capacitor 350.

Node FD is connected to the drain of NMOS transistor 354. The source node 358 of transistor 354 is connected to the drain of transistor 362 whose source is connected to ground. Node 358 is connected to terminal 212 through MOS capacitor 366.

The gate of transistor 362 is connected to the output of NAND gate 370. The output of gate 370 is also connected to the input of inverter 374 whose output is connected to the gate of transistor 354. One input of two-input gate 370 receives the enable signal EN. The enable signal EN is delivered to the other output of gate 370 through three serially connected inverters 374, 378, 382.

In some embodiments, voltage VINT on terminal 212 is an internal power supply voltage that powers also other parts of the integrated circuit containing the latch 210. In some embodiments, the integrated circuit is a synchronous dynamic random access memory (SDRAM). The voltage VINT powers the memory address decoders, command decoding circuitry, burst counting circuitry, and input buffers such as clock enable buffer 386. Buffer 386 receives a clock enable signal CKE from an external pin and generates an internal clock enable ICKE at ground and VINT voltage levels.

In some embodiments, the synchronous DRAM includes several generators 213. Each generator is enabled by its own signal EN. Thus, selective generators 213 can be disabled to reduce power consumption (in stand-by mode, for example). However, at least one generator 213 is enabled throughout the circuit operation in order to power circuits that are never disabled, for example, the buffer 386. Hence, the VINT voltage is a constant value throughout the operation of the integrated circuit.

In some embodiments, the outputs 212 of some or all of the generators 213 are shorted together. However, some generators 213 are sometimes disabled (in stand-by mode for example) when the current drawn from the common terminal 212 of generators 213 is reduced In some embodiments, VINT=2.5V and EVCC=3.3V.

Addendum A provides transistor sizes and resistor values and some other particulars for one embodiment of a VINT generator 213.

Figure 4:
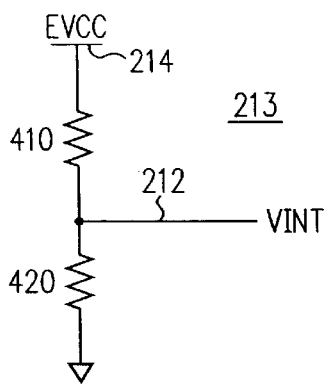
FIGS. 4 and 5 are circuit diagrams of alternative reference voltage generators for the latch of FIG. 2A.
Figure 5:
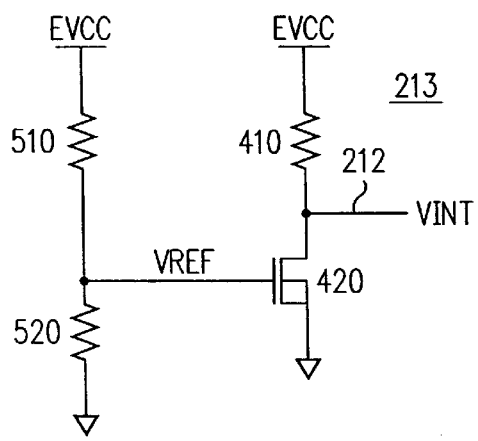

FIGS. 4 and 5 show other embodiments of a VINT generator 213. In FIG. 4, VINT generator 213 is a voltage divider formed by resistors 410, 420 connected in series between EVCC pin 214 and the ground pin of the integrated circuit.

In FIG. 5, resistor 420 is replaced by an NMOS transistor (a long channel transistor in some embodiments) whose body region is connected to the ground terminal. The gate of transistor 420 receives a reference voltage VREF. This voltage is generated by a voltage divider consisting of resistors 510, 520 connected in series between EVCC and ground. When the power is off, the VREF terminal is at ground, and transistor 420 is off. However, the drain/body diode of transistor 420 does not allow the voltage on terminal 212 to rise above one diode threshold relative to ground.

Other resistors are replaced by transistors in some embodiments. Still other embodiments use other VINT generators, known in the art or to be discovered.

Figure 6:
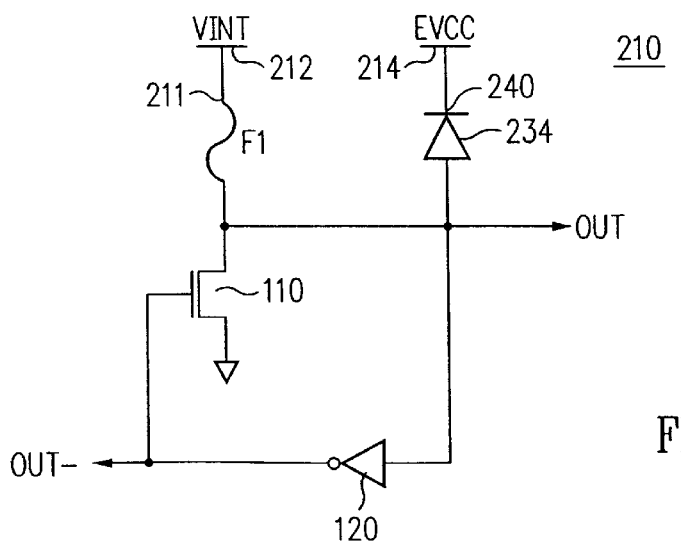
FIGS. 6–8 are circuit diagrams of programmable latches according to the present invention.

Latch 210 of FIG. 6 is identical to the latch of FIG. 2A except that in FIG. 6 the diode cathode 240 is connected to EVCC pin 214.

Some embodiments include two diodes, with one diode connected as in FIG. 6 and the other diode connected as in FIG. 2A. Some embodiments include diodes connected in series or in parallel between the terminal OUT and the terminal 212 or 214.

In some embodiments, the terminals 211 and 240 are both connected to the EVCC terminal 214. Inverter 120 is powered by EVCC. When the power is off, the EVCC terminal is at ground because the integrated circuit includes a voltage divider, such as the voltage divider 213 of FIG. 4, to generate an intermediate voltage.

In some embodiments, diode 234 is omitted. Nevertheless, if fuse F1 is non-conductive, the terminal OUT is at ground before power-up. This is true even if the fuse was programmed electrically and some charge accumulated on terminal OUT during programming. Indeed, after the fuse is programmed (that is, made non-conductive), the power is kept off for a while before the latch is used. For example, if the latch is part of a semiconductor memory, the memory fuses are typically programmed when the memory is tested. Then the power is turned off, and the memory is taken out of the testing equipment and shipped to a customer. By the time the customer supplies power to the memory, any charge which may have accumulated on terminal OUT when the fuse was being programmed has been dissipated. Therefore, the terminal OUT is at ground.

As soon as the terminal OUT- is charged by transistor 220 to a threshold voltage of transistor 110, transistor 110 turns on and keeps the node OUT at the ground voltage. Thus, even if the voltage on terminal OUT increased slightly at the beginning of the power-up operation (that is, when the supply voltage EVCC started rising from 0 volts towards its final value), the terminal OUT is quickly returned to ground. If the power is turned off and then turned on again, the terminal OUT is at zero volts before the power is turned on. Therefore, reliable operation is provided.

In some embodiments, the inverter 120 trip voltage, measured when EVCC has reached its final value, is made high to ensure that the trip voltage will be higher than any voltage on terminal OUT. For example, in some embodiments, the inverter trip voltage is 1.6 V when EVCC=3.3 V. The trip voltage can be made large by making transistor 220 large relative to transistor 230, or by increasing the threshold voltage of transistor 230, or by other methods known or to be discovered.

In some embodiments, the threshold voltage of transistor 110 is made low (lower than the threshold voltages of other NMOS transistors, including transistor 230, in the same integrated circuit), so that even if the terminal OUT is slightly above the inverter trip voltage when the fuse is blown, the inverter will charge the complementary terminal OUT- to a sufficiently high voltage to pull the terminal OUT down. As the terminal OUT is being pulled down, the voltage on terminal OUT- increases, the current through transistor 110 also increases, and eventually the terminal OUT is pulled to ground by the transistor 110.

In some embodiments with or without the diode 234, EVCC=3.3V, the threshold voltage of transistor 230 is 1.2V, the threshold voltage of transistor 220 is –0.8V, and the threshold voltage of transistor 110 is 0.5V. The trip voltage of inverter 120 is 1.6V at the final EVCC value of 3.3V.

Figure 7:
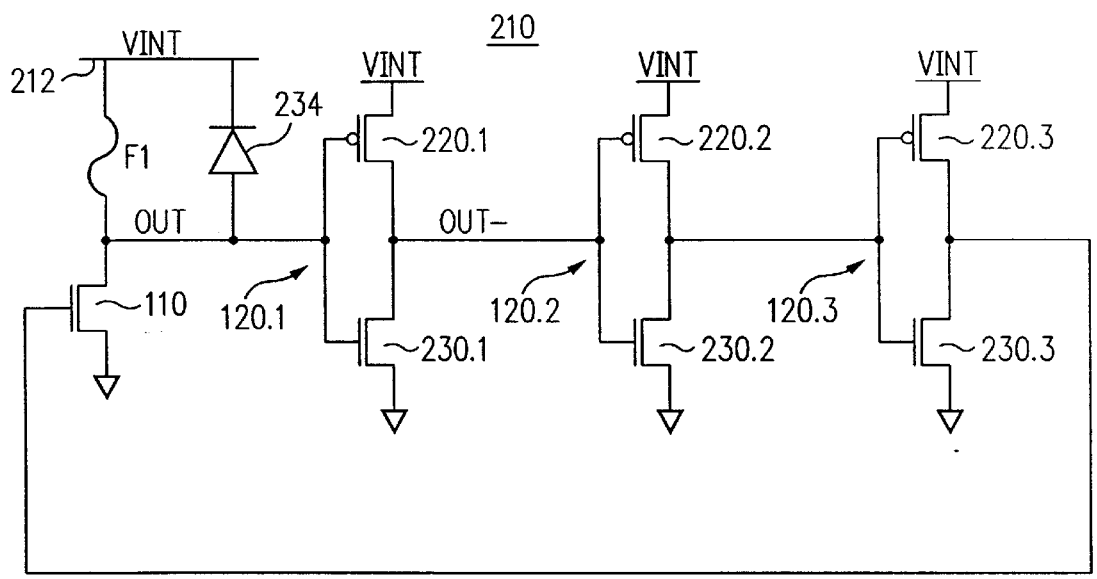

FIG. 7 illustrates another embodiment of latch 210. Fuse F1 and diode 234 are connected to terminals VINT and OUT, and NMOS transistor 110 is connected to the terminal OUT and to the ground terminal, as in FIG. 2A. However, three inverters 120.1, 120.2, 120.3 are provided between the terminal OUT and the gate of transistor 110. In inverter 120.1, the gates of PMOS transistor 220.1 and NMOS transistor 230.1 are connected to the terminal OUT. The source of transistor 220.1 is connected to VINT. The source of transistor 230.1 is connected to ground. The drains of transistors 220.1, 230.1 are connected to the gates of PMOS transistor 220.2 and NMOS transistor 230.2 of inverter 120.2. The drains of transistor 220.2, 230.2 are connected to the gates of PMOS transistor 220.3 and NMOS transistor 230.3 of inverter 120.3. The sources of transistors 220.2, 220.3 are connected to the VINT terminal 212. The sources of transistors 230.2, 230.3 are connected to ground. The drains of transistors 220.3, 230.3 are connected to the gate of transistor 110.

The voltage VINT is generated by some voltage generator such as the generator 213 of FIG. 3.

In some embodiments, diode 234 is omitted, or its cathode is connected to EVCC pin 214.

No capacitor is used in the latch of FIG. 7.

The output of inverter 120.1 (the terminal connected to the drains of transistors 220.1, 230.1) is the complimentary output OUT- of latch 210.

If the fuse F1 is conductive, then terminal OUT is at VINT, and the three inverters keep transistor 110 off. If the fuse is blown, then terminal OUT is at ground, or is at most one diode threshold above ground, for essentially the same reasons as those explained above in connection with FIG. 2A. Therefore, when the power is supplied, transistor 110 is turned on.

In some embodiments, the trip voltage of inverter 120.1 is made high to ensure that when the fuse is blown, the trip voltage will be higher than any possible voltage on the terminal OUT.

In some embodiment, the threshold voltage of transistor 110 is made low (lower than threshold voltages of other NMOS transistors in the same integrated circuit) to facilitate discharge of terminal OUT, similarly to the FIG. 2A embodiment.

Some embodiments include five inverters, or some other number of inverters, connected in series between the terminal OUT and the gate of transistor 110.

Figure 8:
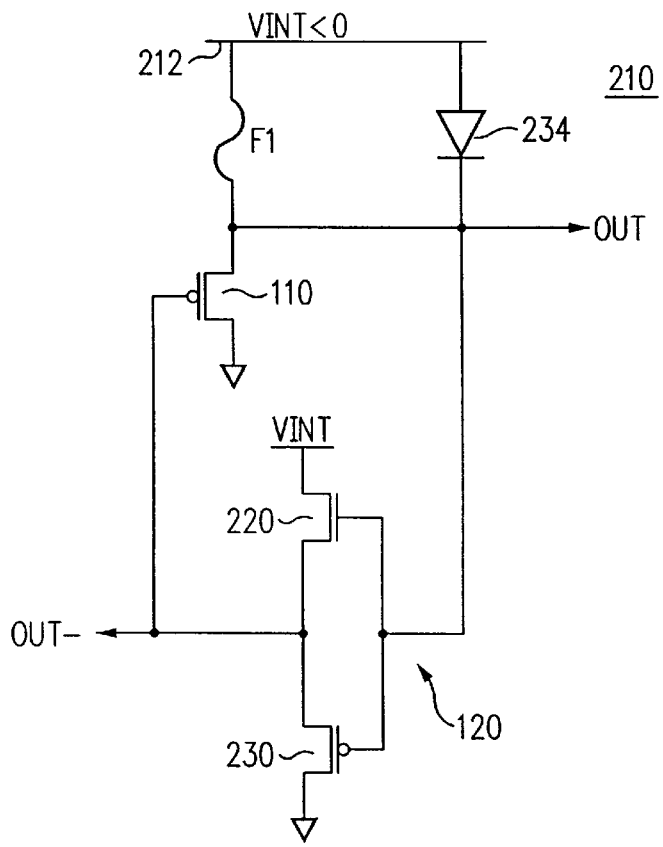

Latch 210 of FIG. 8 is similar to the latch of FIG. 2A, but the supply voltage EVCC and the voltage VINT are negative. Transistors 110 and 230 are PMOS transistors. Transistor 220 is an NMOS transistor. Diode 234 has its anode connected to VINT terminal 212 and its cathode connected to terminal OUT.

Some embodiments of the latch of FIG. 7 or of latches with five or more inverters also use negative supply voltages.

Some embodiments use a non-ground reference voltage instead of the ground.

In some embodiments of FIGS. 2A, 7, 8, fuse F1 is a laser programmable fuse made of polysilicon, metal (for example, aluminum), or some other conductive material. In other embodiments, the fuse F1 is an electrically programmable fuse, for example, a polysilicon fuse which can be blown by current supplied through another transistor (not shown). In still other embodiments, fuse F1 is replaced by some other programmable element, for example, an antifuse, an EPROM, EEPROM, or UPROM cell (see B. Prince, "Semiconductor Memories" (1991), pages 762–764 incorporate herein by reference), or some other non-volatile programmable element known or to be discovered.

In some embodiments, the inverters 120 of FIGS. 2A, 7, 8 are non-CMOS inverters. For example, in some embodiments the pull-up transistors 220 are replaced by suitable resistors or depletion mode transistors.

Programmable latches 210 are suitable for use in a wide variety of memory and non-memory circuits. Some latch embodiments are used in dynamic random access memories. Some latch embodiments are used in spare row and column decoders to select spare rows or columns. Such use of programmable latches is described in U.S. Pat. No. 4,546,455 issued Oct. 8, 1985 to Iwahashi et al. and incorporated herein by reference. In some embodiments, programmable latches 210 are used to adjust delay times or select a clock signal, as described in U.S. Pat. No. 5,440,246 issued Aug. 8, 1995 to Murray et al. and incorporated herein by reference. In some embodiments, the latches 210 are used to salvage defective memories as described in U.S. patent application Ser. No. 08/840,337 filed Apr. 28, 1997 by Li-Chun Li et al. and incorporated herein by reference.

The invention is not limited by the embodiments described above. In some embodiments, transistor 110 is replaced by a variable-impedance electrical path which includes a number of transistors connected in series or in parallel between the terminal OUT and the ground terminal. One or more of the transistors have their gates connected to the output of inverter 120 or 120.3. In some embodiments, other circuit elements (such as resistors, perhaps variable-impedance resistors) are included between the terminal OUT and the ground or VINT terminals. In some embodiments, diode 234 is a Schottky diode. Other embodiments and variations are within the scope of the invention, as defined by the appended claims.

ADDENDUM A

The table below specifies transistor channel width/length dimensions (in micrometers) and resistor values for one embodiment of a VINT generator 213 of FIG. 3. The NAND gate 370 and all the inverters are CMOS circuits.

| Device | Specification |
| --- | --- |
| Resistor R1 | 5.6 KΩ |
| Resistor R2 | 90 KΩ |
| Resistor R3 | 90 KΩ |
| Resistor R4 | 6 KΩ |
| Transistor 310 | 1000/1 |
| Transistor 314 | 50/0.6 |
| Transistor 318 | 100/0.6 |
| Transistor 322 | 50/0.6 |
| Transistor 326 | 100/0.6 |
| Transistors 330 | 100/1 |
| Transistor 334 | 100/1 |
| Transistor 340 | 2/1.5 |
| Transistor 344 | 2/2 |
| Transistor 350 | 2/100 |
| Transistor 354 | 20/1 |
| Transistor 362 | 4/1 |
| Transistor 366 | 2/70 |
| NAND gate 370 | 10/1 for each transistor |
| Inverter 374 | P = 6/1 (PMOS transistor width length), N = 6/1 (NMOS transistor width/length) |
| Inverters 374, 378, 382 | P = 5/1, N = 2/2 |

Each resistor R1, R2, R3, R4 is an N-type diffusion region in a P-type monocrystalline silicon substrate region biased at ground.

What is claimed is:

1. A programmable latch comprising:

a first terminal for receiving a first voltage which is a non-ground voltage;

a second terminal for receiving a second voltage;

a terminal T1 for providing a signal indicating a state of the programmable latch;

a non-volatile programmable element connected to the terminal T1 and the first terminal, the programmable element providing a conductive path between the terminal T1 and the first terminal when the programmable element is conductive, the programmable element isolating the terminal T1 from the first terminal when the programmable element is non-conductive;

a variable-impedance electrical path connected between the terminal T1 and the second terminal, the variable-impedance path having a control terminal for controlling the impedance of the variable impedance path; and one or more serially connected inverters $IV_1, \ldots, IV_n$ ($n \geq 1$), wherein the terminal T1 is connected to an input of inverter $IV_1$, and the control terminal is connected to an output of inverter $IV_n$;

wherein during operation of the latch the signal on the terminal T1 is completely determined by the state of the programmable element and the first and second voltage; and wherein no capacitor is provided between an input of any inverter $IV_i$ (i=1, . . . , n) and the second terminal.

2. The programmable latch of claim 1 wherein the second voltage is ground.

3. The programmable latch of claim 1 wherein the variable-impedance path comprises a transistor connected to and between the second terminal and the terminal T1.

4. The programmable latch of claim 1 wherein the first voltage is about 2.5 V, and the trip voltage of the inverter $IV_1$ at a final value of a voltage that powers the inverter is about 1.6 V.

5. The programmable latch of claim 1 wherein the programmable latch is part of an integrated circuit, and the programmable latch is to control another circuit which is part of the same integrated circuit.

6. The programmable latch of claim 1 wherein the programmable element is a laser programmable fuse.

* * * * *